US008508265B2

(12) United States Patent
Yun (10) Patent No.: US 8,508,265 B2
(45) Date of Patent: Aug. 13, 2013

(54) DIFFERENTIAL CONTROLLED PHASE LOCKED LOOP CIRCUIT

(75) Inventor: Seok Ju Yun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 38 days.

(21) Appl. No.: 13/243,488

(22) Filed: Sep. 23, 2011

(65) Prior Publication Data

US 2012/0146692 A1 Jun. 14, 2012

(30) Foreign Application Priority Data

Dec. 8, 2010 (KR) .................... 10-2010-0125022

(51) Int. Cl.
*H03L 7/06* (2006.01)
(52) U.S. Cl.
USPC ............ 327/146; 327/148; 327/155; 327/157
(58) Field of Classification Search
USPC ............. 327/141, 144–163; 331/1/A, 15–17; 375/373–376
See application file for complete search history.

(56) References Cited

U.S. PATENT DOCUMENTS

| | | | | |
|---|---|---|---|---|
| 5,446,416 A * | 8/1995 | Lin et al. ........................ 331/11 |
| 5,942,949 A * | 8/1999 | Wilson et al. ................... 331/17 |
| 5,953,386 A * | 9/1999 | Anderson ...................... 375/376 |
| 6,242,956 B1 * | 6/2001 | McCollough et al. ........ 327/159 |
| 6,553,089 B2 * | 4/2003 | Huh et al. ...................... 375/376 |
| 7,019,571 B2 * | 3/2006 | Lim ............................... 327/157 |
| 7,187,242 B2 | 3/2007 | Karlsson |
| 7,227,393 B1 * | 6/2007 | Savoj ............................. 327/147 |
| 8,217,692 B2 * | 7/2012 | Al-Shahrani .................. 327/157 |
| 2005/0044030 A1 * | 2/2005 | Lockley et al. ................. 705/37 |
| 2005/0185746 A1 * | 8/2005 | Jung ............................. 375/374 |
| 2005/0206459 A1 * | 9/2005 | Knoll et al. ..................... 331/16 |
| 2005/0218998 A1 * | 10/2005 | Lim ................................ 331/16 |
| 2006/0232344 A1 * | 10/2006 | Badets et al. .................. 331/16 |
| 2007/0195918 A1 * | 8/2007 | Sumiyoshi .................... 375/376 |
| 2007/0241824 A1 * | 10/2007 | Tseng ............................. 331/16 |
| 2008/0061850 A1 * | 3/2008 | Watanabe ...................... 327/157 |

OTHER PUBLICATIONS

Anand Rao et al., "A 4-6.4 GHz LC PLL With Adaptive Bandwidth Control for a Forwarded Clock Link", IEEE Journal of Solid-State Circuits, Sep. 2008, pp. 2099-2108, vol. 43, No. 9, IEEE.
Merrick Brownlee et al., "A 0.5 to 2.5GHz PLL with Fully Differential Supply-Regulated Tuning", International Solid-State Circuits Conference, 2006, pp. 587-589, Session 32, IEEE.

* cited by examiner

*Primary Examiner* — Lincoln Donovan
*Assistant Examiner* — Brandon S Cole (57) ABSTRACT

Provided is a PLL circuit driven with a differential controlled voltage. The PLL circuit includes a VCO. The VCO outputs an oscillation signal in response to a difference between first and second control voltages. The PLL circuit includes a first loop for generating the first control voltage, and a second loop for generating the second control voltage having a phase opposite to the first control voltage. Intermediate generated signals of the first loop and intermediate generated signals of the second loop which respectively correspond to the intermediate generated signals of the first loop have opposed phases.

7 Claims, 6 Drawing Sheets

DIFFERENTIAL CONTROLLED PHASE LOCKED LOOP CIRCUIT

CROSS-REFERENCE TO RELATED APPLICATIONS

This U.S. non-provisional patent application claims priority under 35 U.S.C. §119 of Korean Patent Application No. 10-2010-0125022, filed on Dec. 8, 2010, the entire contents of which are hereby incorporated by reference.

BACKGROUND OF THE INVENTION

The present invention disclosed herein relates to a Phase Locked Loop (PLL) circuit, and more particularly, to a PLL circuit which is driven with a differential controlled voltage.

PLL circuits which are used in wired/wireless communication, signal processing and data processing circuits are frequency feedback circuits that generate a signal having an arbitrary frequency in synchronization with a signal having a reference frequency which is inputted from the outside. The PLL circuits are configured for the frequency of an output signal to be controlled according to a phase difference between a reference signal and an output signal. In the PLL circuits, noise characteristics such as common mode noise and spur noise largely affect performances of analog and digital signal processing circuits. Therefore, research is actively being conducted on the decrease in noises of the PLL circuits.

PLL circuits that operate in a differential control scheme are being used for removing common mode noise. In typical differential controlled PLL circuits, however, spur noises occur due to the up-down current error of a charge pump and ripples that are generated in the control voltages of a Voltage Controlled Oscillator (VCO).

SUMMARY OF THE INVENTION

The present invention provides a Phase Locked Loop (PLL) circuit which is differentially controlled by a positive loop and a negative loop, and removes ripples which are generated in positive and negative control voltages inputted to a Voltage Controlled Oscillator (VCO).

Embodiments of the present invention provide a Phase Locked Loop (PLL) circuit including: a VCO outputting an oscillation signal in response to a difference between first and second control voltages, wherein: the PLL circuit includes a first loop for generating the first control voltage and a second loop for generating the second control voltage having a phase opposite to the first control voltage, and intermediate generated signals of the first loop and intermediate generated signals of the second loop which respectively correspond to the intermediate generated signals of the first loop have opposed phases.

In some embodiments, the first loop may include a first phase frequency detector detecting phase and frequency differences between a reference signal and a division signal for the oscillation signal, and the second loop may include a second phase frequency detector detecting phase and frequency differences between an inverted reference signal and an inverted division signal.

In other embodiments, the first loop may further include a first charge pump controlling a first output current which corresponds to the first control voltage according to the detected result of the first phase frequency detector, and the second loop may further include a second charge pump controlling a second output current which corresponds to the second control voltage according to the detected result of the second phase frequency detector.

In other embodiments of the present invention, a Phase Locked Loop (PLL) circuit includes: a first phase frequency detector outputting a first differential control signal in response to a reference signal and a division signal for an oscillation signal; a second phase frequency detector outputting a second differential control signal in response to an inverted reference signal and an inverted division signal; a first charge pump outputting a first current which is controlled according to the first differential control signal; a second charge pump outputting a second current which is controlled according to the second differential control signal; a first loop filter outputting a first control voltage which corresponds to the first current; a second loop filter outputting a second control voltage which corresponds to the second current; and a VCO outputting the oscillation signal in response to a difference between the first and second control voltages.

In some embodiments, the first and second differential control signals may have opposed phases.

In other embodiments, the first and second currents may have opposed phases.

In still other embodiments, the first and second control voltages may have opposed phases.

In even other embodiments, the PLL circuit may further include a delay circuit delaying the reference signal and the division signal by a half cycle to generate the inverted reference signal and the inverted division signal, respectively.

In yet other embodiments, the PLL circuit may further include a first switch selectively connecting the first charge pump and the first loop filter in response to a first switch control signal; and a second switch selectively connecting the second charge pump and the second loop filter in response to a second switch control signal.

In further embodiments, the PLL circuit may further include a common mode feedback circuit feeding back a Direct Current (DC) voltage to the first and second charge pumps, wherein the DC voltage is outputted in response to change of the first and second currents.

In still other embodiments of the present invention, a Phase Locked Loop (PLL) circuit includes: a first phase frequency detector outputting a first differential control signal in response to a reference signal and a division signal for an oscillation signal; a second phase frequency detector outputting a second differential control signal in response to an inverted reference signal and an inverted division signal; first to third charge pumps outputting first to third currents which are controlled according to the first differential control signal, respectively; a second charge pump outputting a fourth current which is controlled according to the second differential control signal; a first loop filter outputting a first control voltage which corresponds to sum of the first and second currents; a second loop filter outputting a second control voltage which corresponds to sum of the third and fourth currents; and a VCO outputting the oscillation signal in response to a difference between the first and second control voltages.

In some embodiments, the second differential control signal may have a phase which has been further delayed by a half cycle of the reference signal than the first differential control signal.

In other embodiments, the fourth current may have a phase which has been further delayed by a half cycle of the reference signal than the first to third currents.

In still other embodiments, the first control voltage may be changed at every cycle of the reference signal, and the second control voltage may be changed at every half cycle of the reference signal.

In even other embodiments, the PLL circuit may further include a common mode feedback circuit maintaining constant sum of the first to fourth currents.

In yet other embodiments, the PLL circuit may further include a switch circuit selectively connecting the first and second charge pumps to the first loop filter, and selectively connecting the third and fourth charge pumps to the second loop filter, according to an external switch control signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the accompanying drawings, a portion irrelevant to a description of the present invention will be omitted for clarity. Like reference numerals refer to like elements throughout.

In this disclosure below, when one part (or element, device, etc.) is referred to as being 'connected' to another part (or element, device, etc.), it should be understood that the former can be 'directly connected' to the latter, or 'electrically connected' to the latter via an intervening part (or element, device, etc.). Furthermore, when it is described that one comprises (or includes or has) some elements, it should be understood that it may comprise (or include or has) only those elements, or it may comprise (or include or have) other elements as well as those elements if there is no specific limitation.

Figure 1:
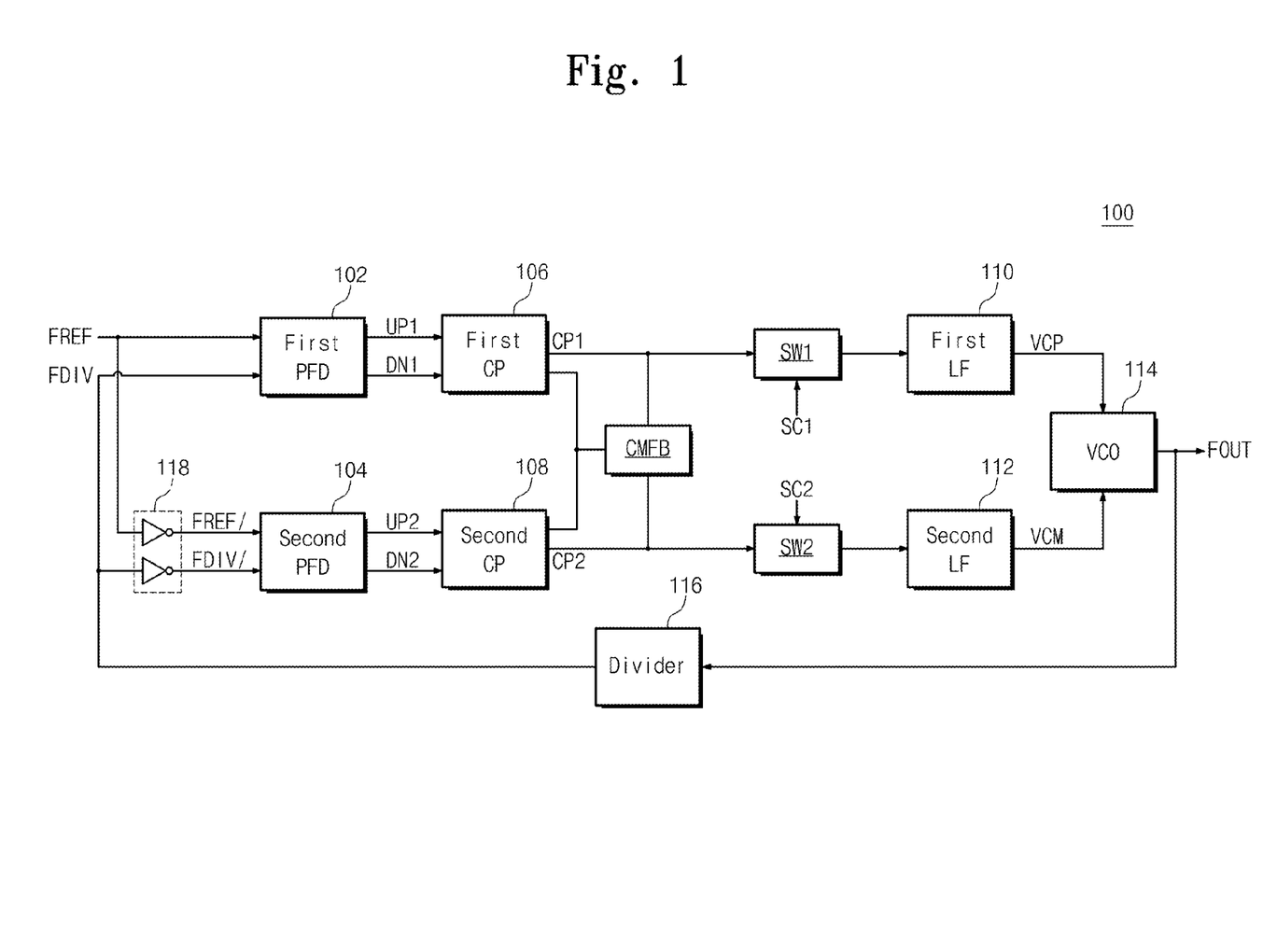
FIG. 1 is a block diagram schematically illustrating a Phase Locked Loop (PLL) circuit according to a first embodiment of the present invention.

FIG. 1 is a block diagram schematically illustrating a Phase Locked Loop (PLL) circuit 100 according to a first embodiment of the present invention.

Referring to FIG. 1, the PLL circuit 100 includes Phase Frequency Detectors (PFDs) 102 and 104, Charge Pumps (CPs) 106 and 108, Loop Filters (LFs) 110 and 112, a Voltage Controlled Oscillator (VCO) 114, a divider 116, a delay circuit 118, a common mode feedback circuit CMFC, and switches SW1 and SW2.

The PLL circuit 100 is configured in a dual feedback loop type for differential control. The first phase frequency detector 102, the first charge pump 106, the first switch SW1, the first loop filter 110, the VCO 114 and the divider 116 configure a first loop. The second phase frequency detector 104, the second charge pump 108, the second switch SW2, the second loop filter 112, the VCO 114, the divider 116 and the delay circuit 118 configure a second loop.

Although FIG. 1 illustrates that the second loop includes the delay circuit 118, the second loop is not limited thereto. One of the first and second loops may include the delay circuit 118.

The first phase frequency detector 102 receives a signal having a reference frequency (FREF, hereinafter referred to as a reference signal) and a feedback signal having a divided frequency (FDIV, hereinafter referred to as a division signal). Herein, the reference signal FREF may be provided from an external system and a crystal oscillator (not shown).

The first phase frequency detector 102 detects phase and frequency differences between the reference signal FREF and the division signal FDIV. Furthermore, the first phase frequency detector 102 outputs a first up signal UP1 and a first down signal DN1 as a first differential control signal according to the phase and frequency differences between the reference signal FREF and the division signal FDIV. For example, the first phase frequency detector 102 outputs the first up signal UP1 when the frequency of the division signal FDIV is lower than that of the reference signal FREF, and outputs the first down signal DN1 when the frequency of the division signal FDIV is higher than that of the reference signal FREF.

The second phase frequency detector 104 receives an inverted reference signal FREF/ and an inverted division signal FDIV/. Herein, the inverted reference signal FREF/ may be obtained by delaying the reference signal FREF by a half cycle, and the inverted division signal FDIV/ may be obtained by delaying the division signal FDIV by a half cycle.

The second phase frequency detector 104 detects phase and frequency differences between the inverted reference signal FREF/ and the inverted division signal FDIV/. The second phase frequency detector 104 outputs a second up signal UP2 and a second down signal DN2 as a second differential control signal according to the phase and frequency differences between the inverted reference signal FREF/and the inverted division signal FDIV/. For example, the second phase frequency detector 104 outputs the second up signal UP2 when the frequency of the inverted division signal FDIV/ is lower than that of the inverted reference signal FREF/, and outputs the second down signal DN2 when the frequency of the inverted division signal FDIV/ is higher than that of the inverted reference signal FREF/.

The first charge pump 106 controls a first output current CP1 in response to the first up signal UP1 and the first down signal DN1. For example, the first charge pump 130 performs a current sourcing operation in order to increase the first output current CP1 in response to the first up signal UP1, and performs a current sinking operation in order to decrease the first output current CP1 in response to the first down signal DN1.

The second charge pump 108 controls a second output current CP2 in response to the second up signal UP2 and the second down signal DN2. For example, the second charge pump 108 performs a current sourcing operation in order to increase the second output current CP2 in response to the second up signal UP2, and performs a current sinking operation in order to decrease the second output current CP2 in response to the second down signal DN2.

Herein, the first and second charge pumps 106 and 108 generate the first and second output currents CP1 and CP2 showing complementary characteristic.

Each of the loop filters 110 and 112 may be configured as a low pass filter that includes at least one resistor and capacitor. The first loop filter 110 filters high frequency noise of the first output current CP1. Furthermore, the loop filter 110 outputs a first control voltage VCP corresponding to the filtered first output current CP1. The second loop filter 112 filters high frequency noise of the second output current CP2. Furthermore, the second loop filter 112 outputs a second control voltage VCM corresponding to the filtered second output current CP2.

The VCO 114 outputs an oscillation signal FOUT having a frequency which corresponds to the first and second control voltages VCP and VCM. This denotes that the VCO 114 is implemented in a differential type.

The divider 116 generates the division signal FDIV having a frequency that is obtained by lowering the frequency of the oscillation signal FOUT outputted from the VCO 114 to a predetermined dividing ratio.

The delay circuit 118 delays the reference signal FREF by a half cycle to generate the inverted reference signal FREF/, and delays the division signal FDIV by a half cycle to generate the inverted division signal FDIV/. Although FIG. 1 illustrates that the delay circuit 118 includes inverters for generating the inverted reference signal FREF/ and the inverted division signal FDIV/, the delay circuit 118 is not limited thereto. The delay circuit 118 may be variously configured for inverting and outputting an input signal.

In order to maintain the constant sum of the first and second output currents CP1 and CP2, the common mode feedback circuit CMFB feeds back a Direct Current (DC) voltage, which is outputted in response to the change of the first and second output currents CP1 and CP2, to the first and second charge pumps 106 and 108. Furthermore, as the constant sum of the first and second output currents CP1 and CP2 is maintained by the common mode feedback circuit CMFB, the sum of the first and second control voltages VCP and VCM respectively corresponding to the first and second output currents CP1 and CP2 is also maintained.

The first switch SW1 selectively connects the first charge pump 106 and the first loop filter 110 in response to a first switch control signal SC1 provided from outside. The second switch SW2 selectively connects the second charge pump 108 and the second loop filter 112 in response to a second switch control signal SC2 provided from outside. Therefore, operations of the first and second loops may be selected by the first and second switches SW1 and SW2.

In typical differential controlled PLL circuits, the frequency of an oscillation signal FOUT is locked, and then ripples with opposed phases may be generated in two control voltages inputted to a VCO, respectively. Since a differential controlled voltage corresponds to a difference (VCP−VCM) between the two control voltages, the ripples with opposed phases are summed and appear in the differential controlled voltage (VCP−VCM). Therefore, spur noise of the oscillation signal FOUT that is generated in response to the differential controlled voltage (VCP−VCM) increases. However, suppression of the spur noise is required for guaranteeing the stable output signal of the PLL circuit.

As described above, in the PLL circuit 100 according to the first embodiment of the present invention, the first and second control voltages VCP and VCM inputted to the differential VCO 114 have the opposed phases.

To provide more detailed description, the PLL circuit 100 includes the first loop for generating the first control voltage VCP, and the second loop for generating the second control voltage VCM. The first loop includes the first phase frequency detector 102, the first charge pump 106, the first loop filter 110, etc. The second loop includes the second phase frequency detector 104, the second charge pump 108, the second loop filter 112, etc.

One of the first and second loops includes the delay circuit 118 for generating phase differences between signals inputted to the first phase frequency detector 102 and the signals inputted to the second phase frequency detector 104. For example, when the second loop includes the delay circuit 118, the reference signal FREF and the division signal FDIV are inputted to the first phase frequency detector 102, and the inverted reference signal FREF/ and the inverted division signal FDIV/ are inputted to the second phase frequency detector 104. Herein, the inverted reference signal FREF/ is generated by delaying the reference signal FREF by a half cycle, and the inverted division signal FDIV/ is generated by delaying the division signal FDIV by a half cycle.

Such phase delay also appears in the signals UP2 and DN2 outputted by the second phase frequency detector 104, the current CP2 outputted by the second charge pump 108 and the control voltage VCP outputted by the second loop filter 112. This denotes that the first and second control voltages VCP and VCM have the opposed phases.

According to the first embodiment of the present invention, since the first and second control voltages VCP and VCM have the opposed phases, ripples that are generated in the first and second control voltages VCP and VCM have the same phase. Therefore, the ripples of the first and second control voltages VCP and VCM are offset, only the DC components of the first and second control voltages VCP and VCM appear in the differential control voltage (VCP−VCM). As a result, the ripple of the differential control voltage (VCP−VCM) decreases, and thus the spur noise of the oscillation signal FOUT is suppressed.

Figure 2:
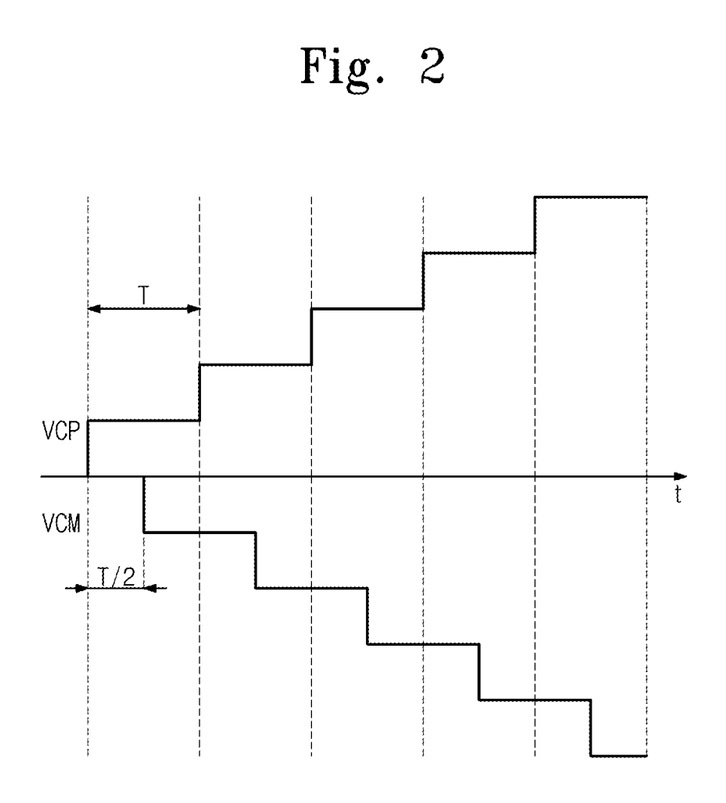
FIG. 2 is a diagram exemplarily showing operation characteristics of control voltages of the PLL circuit in FIG. 1.

FIG. 2 is a diagram exemplarily showing operation characteristics of the control voltages VCP and VCM of the PLL circuit 100 in FIG. 1.

Referring to FIG. 2, the control voltages VCP and VCM are changed in response to the reference signal FREF that is changed at every certain cycle T.

In the PLL circuit 100 according to the first embodiment of the present invention, due to a dual loop configuration that generates a phase difference between signals corresponding to each other, the second control voltage VCM is delayed by a half cycle T/2 of the reference signal FREF compared to the first control voltage VCP and then changed. That is, the first and second control voltages VCP and VCM have the opposed phases.

Figure 3:
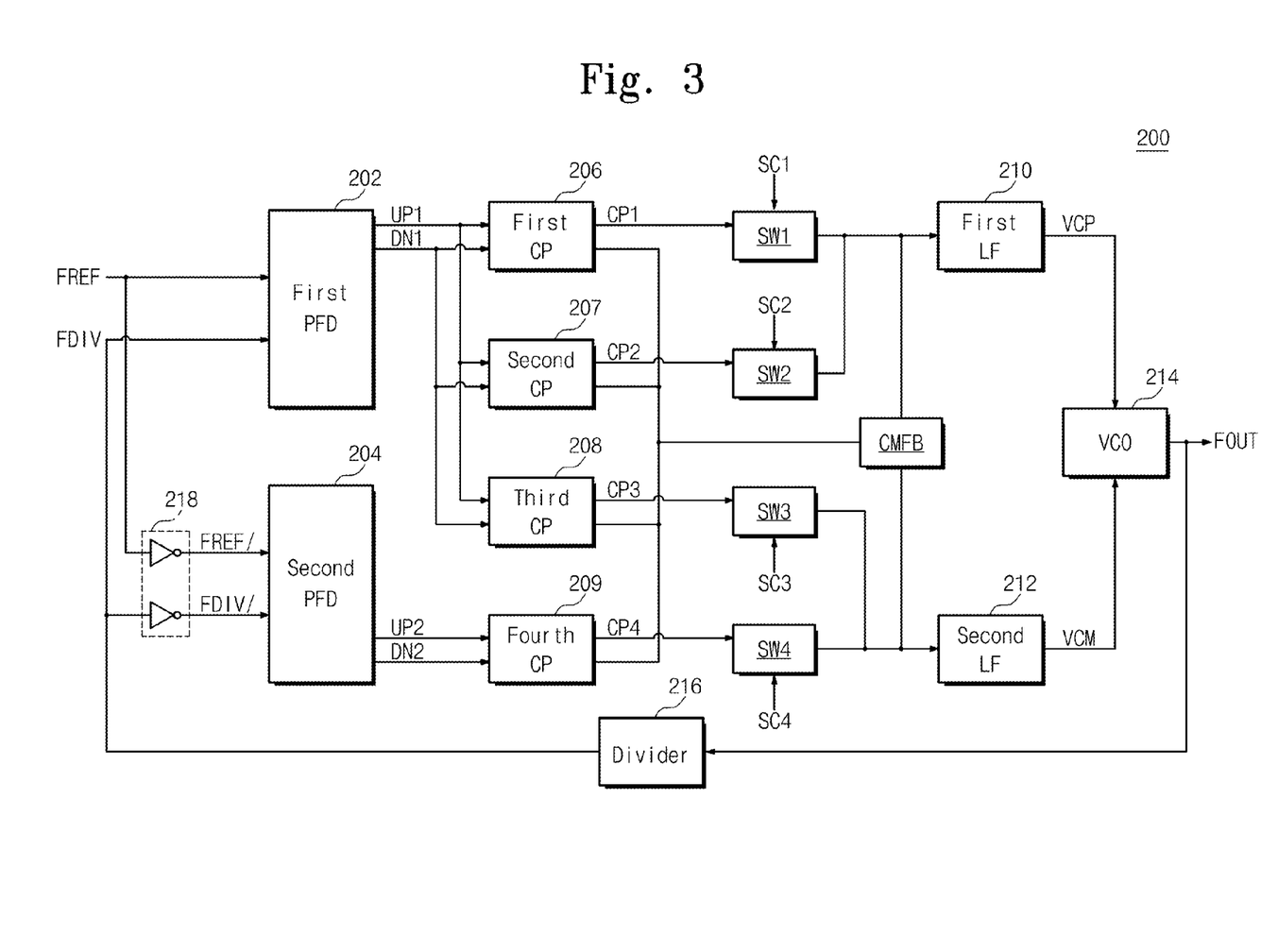
FIG. 3 is a block diagram schematically illustrating a PLL circuit according to a second embodiment of the present invention.

FIG. 3 is a block diagram schematically illustrating a PLL circuit 200 according to a second embodiment of the present invention.

Referring to FIG. 3, the PLL circuit 200 includes Phase Frequency Detectors (PFDs) 202 and 204, Charge Pumps (CPs) 206 to 209, Loop Filters (LFs) 210 and 212, a Voltage Controlled Oscillator (VCO) 214, a divider 216, a delay circuit 218, a common mode feedback circuit CMFC, and switches SW1 to SW4. Hereinafter, repetitive description on the same elements as those of FIG. 1 will be omitted.

The first phase frequency detector 202 detects phase and frequency differences between a reference signal FREF and a division signal FDIV.

Furthermore, the first phase frequency detector 202 outputs a first up signal UP1 and a first down signal DN1 according to the phase and frequency differences between the reference signal FREF and the division signal FDIV.

The second phase frequency detector 204 detects phase and frequency differences between an inverted reference signal FREF/ and an inverted division signal FDIV/. The second phase frequency detector 204 outputs a second up signal UP2 and a second down signal DN2 according to the phase and frequency differences between the inverted reference signal FREF/ and the inverted division signal FDIV/.

The first to third charge pumps 206 to 208 control first to third output currents CP1 to CP3 in response to the first up signal UP1 and the first down signal DN1, respectively. The fourth charge pump 209 controls a fourth output current CP4 in response to the second up signal UP2 and the second down signal DN2. The fourth output current CP4 has a phase that has been further delayed by a half cycle of the reference signal FREF than the first to third output currents CP1 to CP3.

Herein, the first and third charge pumps 206 and 208 generate the first and third output currents CP1 and CP3 showing complementary characteristic, respectively. Also, the second and fourth charge pump 207 and 209 generate the second and fourth output currents CP2 and CP4 showing complementary characteristic, respectively.

The first loop filter 210 outputs the first control voltage VCP corresponding to the sum of the filtered first and second output currents CP1 and CP2. The second loop filter 212 outputs the second control voltage VCM corresponding to the sum of the filtered third and fourth output currents CP3 and CP4.

Since the first control voltage VCP corresponds to the sum of the first and second output currents CP1 and CP2 having the same phase, it is changed at every cycle of the reference signal FREF. Since the second control voltage VCM corresponds to the sum of the third and fourth output currents CP3 and CP4 with opposed phases, it is changed at every half cycle of the reference signal FREF. That is, the first and second control voltages VCP and VCM have different change cycles. This will be described below in more detail with reference to FIG. 4.

In order to maintain the constant sum of the first to fourth output currents CP1 to CP4, the common mode feedback circuit CMFB feeds back a DC voltage, which is outputted in response to the change of the first to fourth output currents CP1 to CP4, to the first to fourth charge pumps 206 to 209. Furthermore, as the constant sum of the first to fourth output currents CP1 to CP4 is maintained by the common mode feedback circuit CMFB, the constant sum of the first and second control voltages VCP and VCM is maintained, wherein the first control voltage VCP corresponds to the sum of the first and second output currents CP1 and CP2 and the second control voltage VCM corresponds to the sum of third and fourth output currents CP3 and CP4.

The first switch SW1 selectively connects the first charge pump 206 and the first loop filter 210 in response to a first switch control signal SC1 provided from outside. The second switch SW2 selectively connects the second charge pump 207 and the first loop filter 210 in response to a second switch control signal SC2 provided from outside. The third switch SW3 selectively connects the third charge pump 208 and the second loop filter 212 in response to a third switch control signal SC3 provided from outside. The fourth switch SW4 selectively connects the fourth charge pump 209 and the second loop filter 212 in response to a fourth switch control signal SC4 provided from outside. Therefore, the first to fourth output currents CP1 to CP4 may be selectively transferred to a corresponding loop filter among the loop filters 210 and 212 by the first to fourth switches SW1 to SW4.

As described above, the PLL circuit 200 according to the second embodiment of the present invention, the change cycles of the first and second control voltages VCP and VCM inputted to the differential VCO 214 differ.

According to the second embodiment of the present invention, since the change cycles of the first and second control voltages VCP and VCM differ, reference frequency component of the oscillation signal FOUT decreases. Therefore, spur noise of the oscillation signal FOUT is suppressed.

Figure 4:
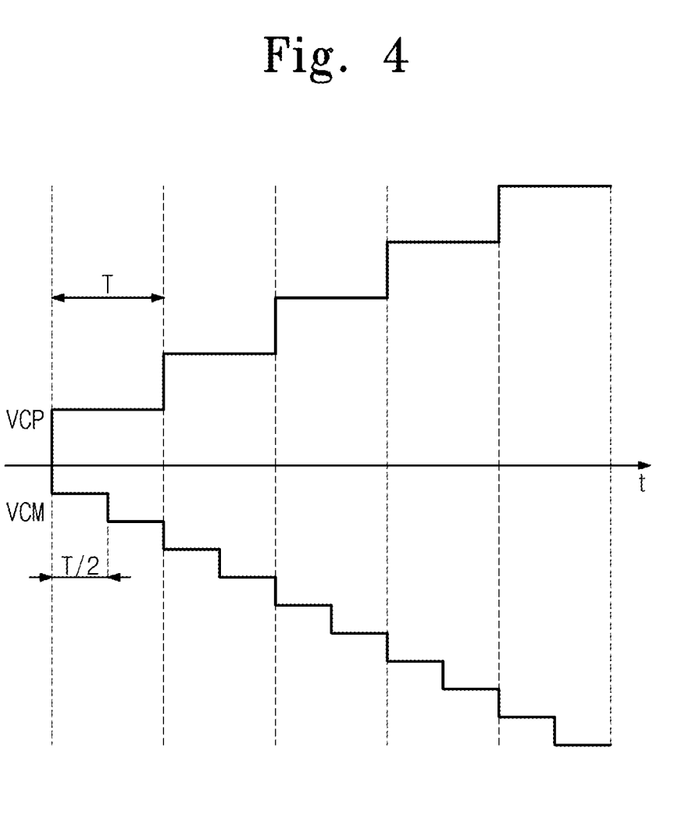
FIG. 4 is a diagram exemplarily showing operation characteristics of control voltages of the PLL circuit in FIG. 3.

FIG. 4 is a diagram exemplarily showing operation characteristics of the control voltages VCP and VCM of the PLL circuit 200 in FIG. 3.

In FIG. 4, it is illustrated that the control voltages VCP and VCM are changed in response to the reference signal FREF which is changed at every certain cycle T.

Referring to FIGS. 3 and 4, in the PLL circuit 200 according to the second embodiment of the present invention, the first and second output currents CP1 and CP2 having the same phase overlap and thus the first control voltage VCP is generated. The third and fourth output currents CP3 and CP4 having opposed phases, i.e., a phase difference equal to a half cycle T/2 of the reference signal FREF overlap and thus the second control voltage VCM is generated. Therefore, the first control voltage VCP is changed at every cycle T of the reference signal FREF, and the second control voltage VCM is changed at every half cycle T/2 of the reference signal FREF.

Figure 5:
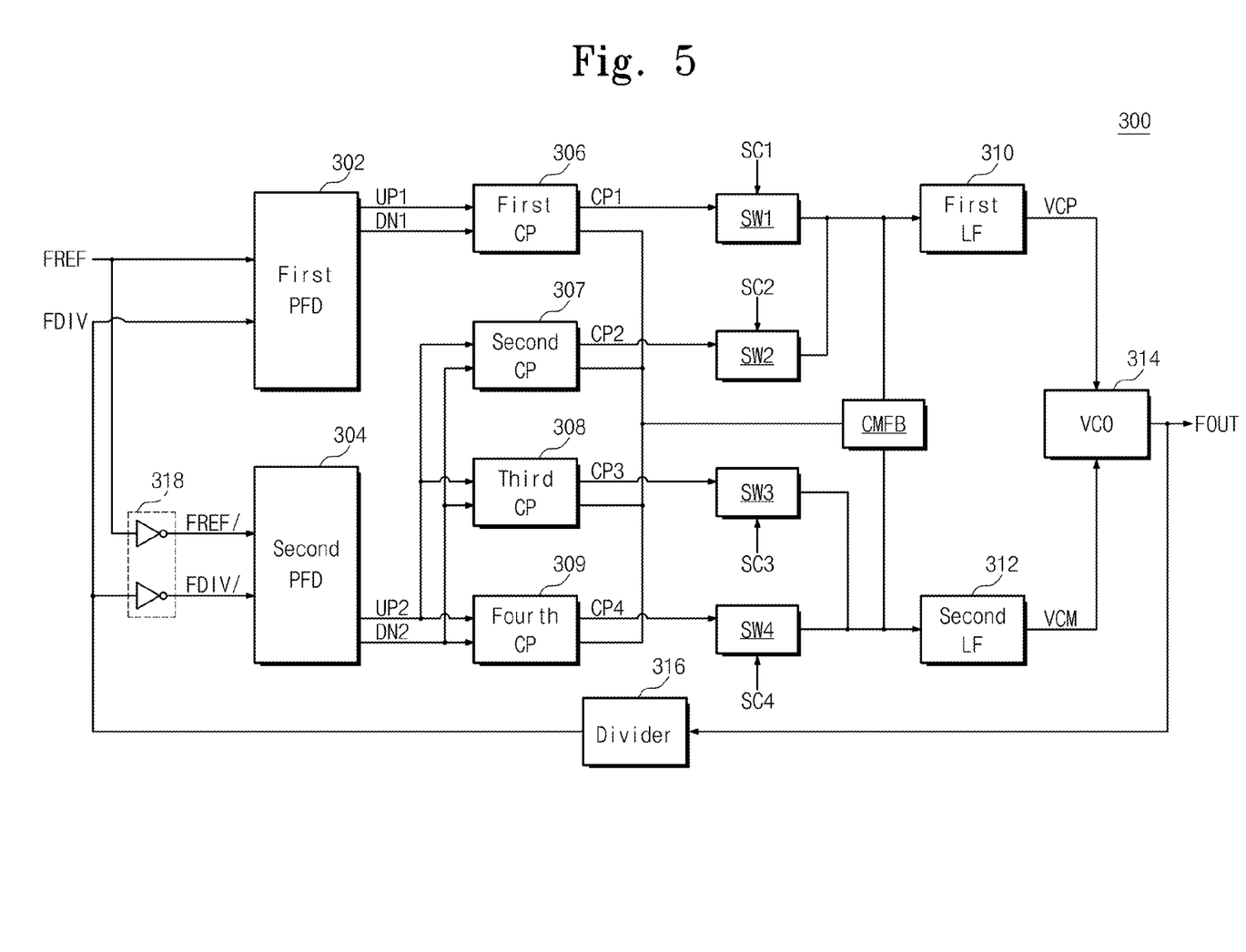
FIG. 5 is a block diagram schematically illustrating a modification example of the PLL circuit according to the second embodiment of the present invention.

FIG. 5 is a block diagram schematically illustrating a modification example 300 of the PLL circuit according to the second embodiment of the present invention.

Referring to FIG. 5, a PLL circuit 300 includes Phase Frequency Detectors (PFDs) 302 and 304, Charge Pumps (CPs) 306 to 309, Loop Filters (LFs) 310 and 312, a Voltage Controlled Oscillator (VCO) 314, a divider 316, a delay circuit 318, a common mode feedback circuit CMFC, and switches SW1 to SW4. Hereinafter, repetitive description on the same elements as those of the PLL circuits 100 and 200 according to the first and second embodiments of the present invention will be omitted.

The first phase frequency detector 302 detects phase and frequency differences between a reference signal FREF and a division signal FDIV. Furthermore, the first phase frequency detector 302 outputs a first up signal UP1 and a first down signal DN1 according to the phase and frequency differences between the reference signal FREF and the division signal FDIV.

The second phase frequency detector 304 detects phase and frequency differences between an inverted reference signal FREF/ and an inverted division signal FDIV/. The second phase frequency detector 304 outputs a second up signal UP2 and a second down signal DN2 according to the phase and frequency differences between the inverted reference signal FREF/ and the inverted division signal FDIV/.

The first charge pump 306 controls a first output current CP1 in response to the first up signal UP1 and the first down signal. The second to fourth charge pumps 307 to 309 control second to fourth output currents CP2 to CP4 in response to the second up signal UP2 and the second down signal DN2, respectively. Herein, the first output current CP4 has a phase that has been further delayed by a half cycle of the reference signal FREF than the second to fourth output currents CP2 to CP4.

Since the first control voltage VCP corresponds to the sum of the first and second output currents CP1 and CP2 with opposed phases, it is changed at every half cycle of the reference signal FREF. Since the second control voltage VCM corresponds to the sum of the third and fourth output currents CP3 and CP4 having the same phase, it is changed at every cycle of the reference signal FREF. That is, the first and second control voltages VCP and VCM have different change cycles.

Unlike the change cycle of the second control voltage VCM being controlled in the PLL circuit 200 according to the second embodiment of the present invention, the change cycle of the first control voltage VCP is controlled in the PLL circuit 300 according to the modification example of the present invention. This will be described below in more detail with reference to FIG. 6.

Figure 6:
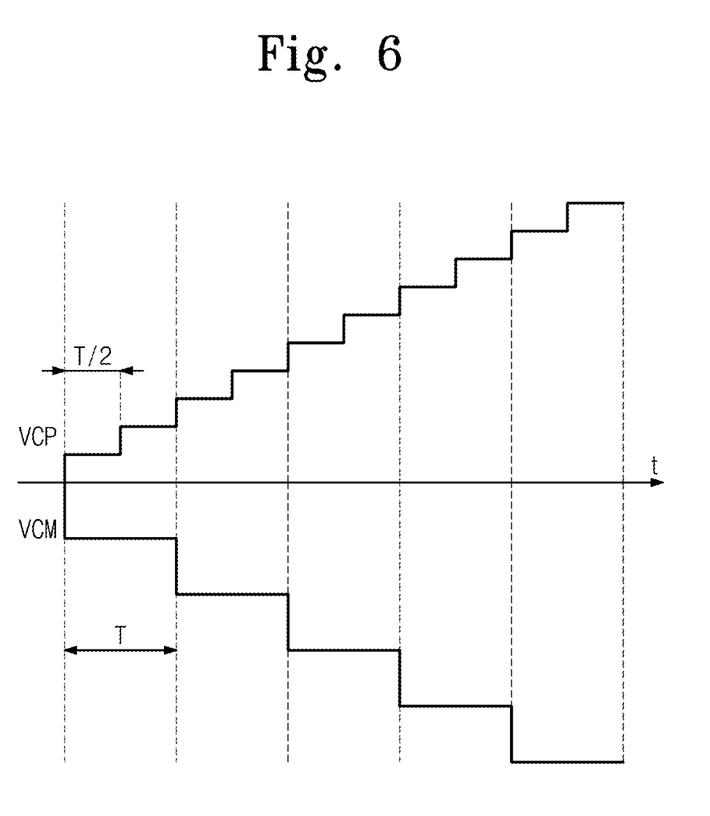
FIG. 6 is a diagram exemplarily showing operation characteristics of control voltages of the PLL circuit in FIG. 5.

FIG. 6 is a diagram exemplarily showing operation characteristics of the control voltages VCP and VCM of the PLL circuit 300 in FIG. 5.

In FIG. 6, it is illustrated that the control voltages VCP and VCM are changed in response to the reference signal FREF which is changed at every certain cycle T.

Referring to FIGS. 5 and 6, in the PLL circuit 300 according to the modification example of the present invention, the first and second output currents CP1 and CP2 having opposed phases, i.e., a phase difference equal to a half cycle T/2 of the reference signal FREF overlap and thus the first control voltage VCP is generated. The third and fourth output currents CP3 and CP4 having the same phase overlap and thus the second control voltage VCM is generated. Therefore, the first control voltage VCP is changed at every half cycle T/2 of the reference signal FREF, and the second control voltage VCM is changed at every cycle T of the reference signal FREF.

According to the PLL circuit according to embodiments of the present invention, by controlling the phase and frequency of one of the positive and negative control voltages, the spur noise and phase noise appearing in the output signal can decrease.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A phase locked loop (PLL) circuit, comprising:
a first phase frequency detector configured to output a first differential control signal in response to a reference signal and a division signal for an oscillation signal;
a second phase frequency detector configured to output a second differential control signal in response to an inverted reference signal and an inverted division signal;
a first charge pump configured to output a first current that is controlled according to the first differential control signal;
a second charge pump configured to output a second current that is controlled according to the second differential control signal;
a first loop filter configured to output a first control voltage that corresponds to the first current;
a second loop filter configured to output a second control voltage that corresponds to the second current;
a voltage controlled oscillator (VCO) configured to output the oscillation signal in response to a difference between the first and second control voltages;
a first switch configured to selectively couple the first charge pump and the first loop filter in response to a first switch control signal; and
a second switch configured to selectively couple the second charge pump and the second loop filter in response to a second switch control signal.

2. A Phase Locked Loop (PLL) circuit comprising:
a first phase frequency detector configured to output a first differential control signal in response to a reference signal and a division signal for an oscillation signal;
a second phase frequency detector configured to output a second differential control signal in response to an inverted reference signal and an inverted division signal;
first to third charge pumps configured to output first to third currents that are controlled according to the first differential control signal, respectively;
a fourth charge pump configured to output a fourth current that is controlled according to the second differential control signal;
a first loop filter configured to output a first control voltage that corresponds to a sum of the first and second currents;
a second loop filter configured to output a second control voltage that corresponds to a sum of the third and fourth currents; and
a Voltage Controlled Oscillator (VCO) configured to output the oscillation signal in response to a difference between the first and second control voltages.

3. The PLL circuit of claim 2, wherein the second differential control signal has a phase which has been delayed further than the first differential control signal by a half cycle of the reference signal.

4. The PLL circuit of claim 2, wherein the fourth current has a phase which has been delayed further than the first to third currents by a half cycle of the reference signal.

5. The PLL circuit of claim 2, wherein:
the first control voltage is changed at every cycle of the reference signal, and
the second control voltage is changed at every half cycle of the reference signal.

6. The PLL circuit of claim 2, further comprising a common mode feedback circuit configured to maintain the sum of the first to fourth currents to be constant.

7. The PLL circuit of claim 2, further comprising a switch circuit configured to selectively couple the first and second charge pumps to the first loop filter, and selectively couple the third and fourth charge pumps to the second loop filter, according to an external switch control signal.

* * * * *